US011979993B2

(12) United States Patent
Sugiyama

(10) Patent No.: US 11,979,993 B2
(45) Date of Patent: May 7, 2024

(54) HEAT DISSIPATION STRUCTURE

(71) Applicant: NEC Platforms, Ltd., Kawasaki (JP)

(72) Inventor: Kazuma Sugiyama, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 388 days.

(21) Appl. No.: 17/292,756

(22) PCT Filed: Sep. 26, 2019

(86) PCT No.: PCT/JP2019/038028
§ 371 (c)(1),
(2) Date: May 11, 2021

(87) PCT Pub. No.: WO2020/100447
PCT Pub. Date: May 22, 2020

(65) Prior Publication Data
US 2021/0400825 A1 Dec. 23, 2021

(30) Foreign Application Priority Data
Nov. 13, 2018 (JP) .................. 2018-213184

(51) Int. Cl.
H05K 5/02 (2006.01)
H05K 7/20 (2006.01)
(52) U.S. Cl.
CPC .............. H05K 5/02 (2013.01); H05K 7/20 (2013.01)
(58) Field of Classification Search
CPC ............ H05K 5/02; H05K 7/20; H05K 5/069; H05K 7/20336; F28D 15/0275
See application file for complete search history.

(56) References Cited

U.S. PATENT DOCUMENTS

2006/0002081 A1* 1/2006 Hongo .................. G06F 1/203
361/691
2011/0222237 A1 9/2011 Fujiwara et al.
(Continued)

FOREIGN PATENT DOCUMENTS

| CN | 2699477 Y | 5/2005 |
| CN | 200980219 Y | 11/2007 |
| CN | 101287350 A | 10/2008 |

(Continued)

OTHER PUBLICATIONS

Extended European Search Report for EP Application No. EP19885063.8 dated Jun. 1, 2022.
(Continued)

Primary Examiner — Lionel Nouketcha

(57) ABSTRACT

A heat dissipation structure (1) includes a heat generation part (2) and an internal heat dissipation part (3), inside a housing (8); a heat transport member (4); an external heat dissipation part (5); and a fixing member (6), wherein edges are vertically disposed on both sides of the heat transport member (4), in the vicinity of the fixing member (6) in a first groove (3a); a second groove (6b) extending from the through hole (6a) toward an area not covered with the external heat dissipation part (5) is formed in the second surface (6d); and a gap portion between the heat transport member (4) and the through hole (6a), a portion between the edges vertically disposed on both sides of the heat transport member (4), and the second groove (6b) are filled with a sealant.

5 Claims, 9 Drawing Sheets

(56) References Cited

U.S. PATENT DOCUMENTS

2013/0153175 A1* 6/2013 Lin .................... H05K 7/20318
                                                            165/104.26
2015/0354902 A1* 12/2015 McDonald ......... H05K 7/14337
                                                            165/45

FOREIGN PATENT DOCUMENTS

| | | |
|---|---|---|
| DE | 2920577 A1 | 11/1980 |
| JP | S61-034744 U | 3/1986 |
| JP | H03-005079 U | 1/1991 |
| JP | H04-123463 A | 4/1992 |
| JP | H07-113589 A | 5/1995 |
| JP | H11-233963 A | 8/1999 |
| JP | 2008-165699 A | 7/2008 |
| JP | 2009-252646 A | 10/2009 |
| JP | 2014-197620 A | 10/2014 |

OTHER PUBLICATIONS

Japanese Office Communication for JP Application No. 2018-213184, dated Jun. 9, 2020 with English Translation.
International Search Report for PCT Application No. PCT/JP2019/038028, dated Dec. 3, 2019.
Japanese Office Action for JP Application No. 2018-213184, dated Jun. 9, 2020 with English Translation.
CN Office Communication for CN Application No. 201980074246.4, mailed on Jan. 4, 2024 with English Translation.

* cited by examiner

HEAT DISSIPATION STRUCTURE

This application is a National Stage Entry of PCT/JP2019/038028 filed on Sep. 26, 2019, which claims priority from Japanese Patent Application 2018-213184 filed on Nov. 13, 2018, the contents of all of which are incorporated herein by reference, in their entirety.

TECHNICAL FIELD

The present invention relates to a heat dissipation structure.

BACKGROUND ART

There has been known a heat dissipation structure for dissipating heat of a heat generation part inside a housing of an electronic device or the like. Patent Literature 1 discloses a configuration of a heat dissipation structure including a heat generation part disposed inside a housing, an air passage which is disposed outside the housing and through which air flows, and a bar-shaped heat transport member such as a heat pipe which connects the heat generation part and the air passage. Furthermore, Patent Literature 1 discloses a configuration in which a plurality of fins is disposed side by side at a portion of the heat transport member located in the air passage, along the extending direction of the heat transport member.

CITATION LIST

Patent Literature

Patent Literature 1: Japanese Unexamined Patent Application Publication No. 2008-165699

SUMMARY OF INVENTION

Technical Problem

In the case where a configuration of a heat dissipation structure in which, as in Patent Literature 1, the inside and outside of a housing are connected by a heat transport member is used for a device to be installed outdoors, waterproofing of an area where the bar-shaped heat transport member is protruded from inside to outside the housing is indispensable. Patent Literature 1 has no description about the use of the disclosed heat dissipation structure for an outdoor device and accordingly also has no description about a waterproof structure of an area where the bar-shaped heat transport member is protruded from inside to outside the housing.

In view of the above-described problem, an object of the present disclosure is to provide a heat dissipation structure which can, in the case where a configuration in which the inside and outside of a housing are connected by a heat transport member to dissipate heat inside the housing to outside is used for a device to be installed outdoors, suppress entering of water into the housing through the heat transport member.

Solution to Problem

A heat dissipation structure according to a first aspect of the present invention includes a heat generation part provided inside a housing; an internal heat dissipation part provided inside the housing for receiving heat from the heat generation part; a heat transport member having a bar shape and protruding from inside the housing to outside the housing, in which a part of a portion inside the housing is fitted in a first groove formed on a surface of the internal heat dissipation part, so as to transport heat from the internal heat dissipation part to outside the housing; an external heat dissipation part including a plurality of fins disposed side by side at a part of a portion of the heat transport member outside the housing; and a fixing member disposed between the internal heat dissipation part and the external heat dissipation part and having a through hole for passage of the heat transport member, in which a first surface facing the internal heat dissipation part is in contact with the internal heat dissipation part and a second surface facing the external heat dissipation part is in contact with the external heat dissipation part, wherein a second groove extending from the through hole toward an area not covered with the external heat dissipation part is formed in the second surface, and a gap portion between the heat transport member and the through hole and the second groove are filled with a sealant for waterproofing.

Advantageous Effects of Invention

In the case where the configuration in which the inside and outside of the housing are connected by the heat transport member to dissipate heat inside the housing to outside is used for a device to be installed outdoors, the present invention can suppress entering of water into the housing through the heat transport member.

DESCRIPTION OF EMBODIMENTS

Figure 1:
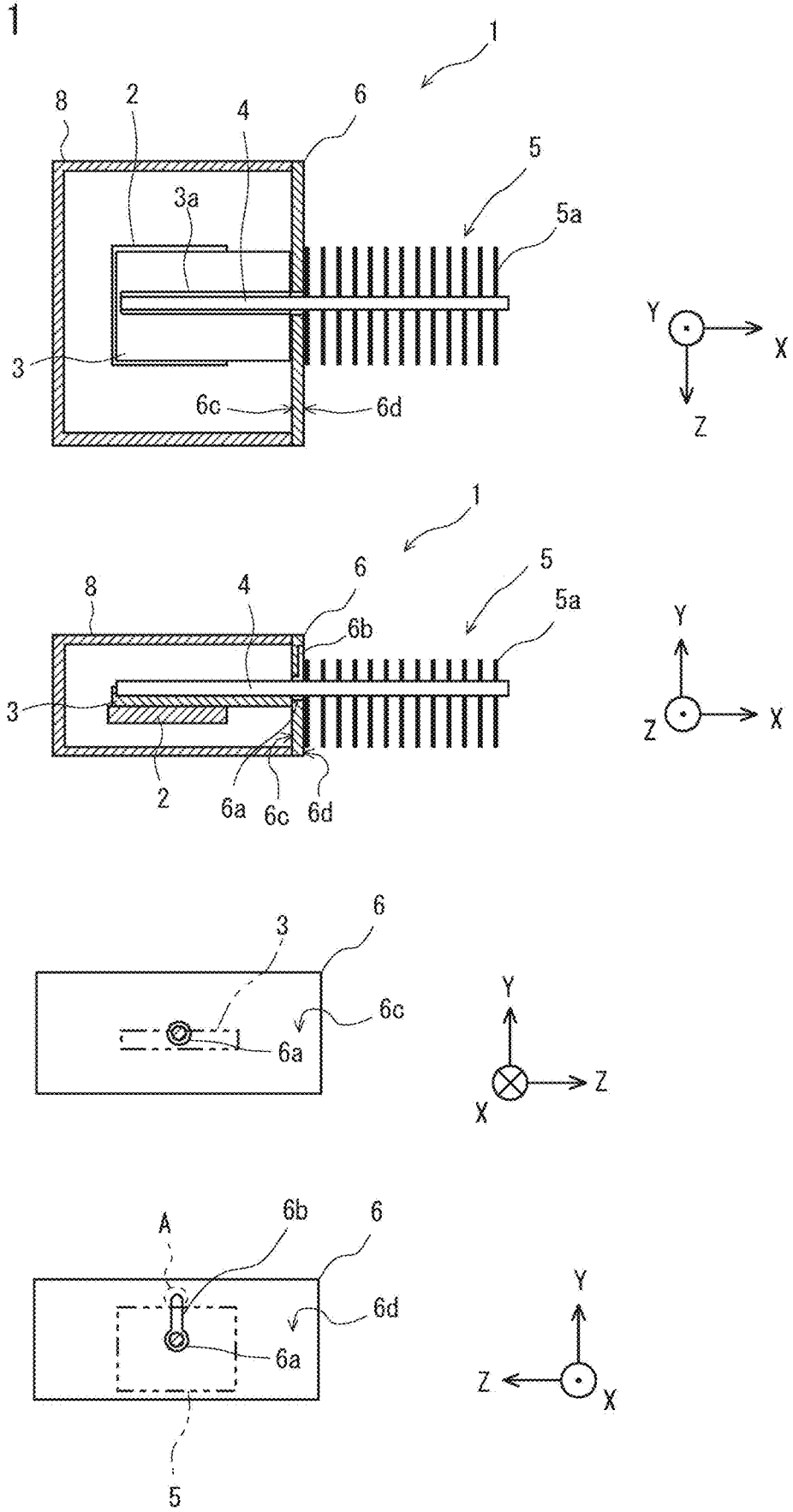
FIG. 1 is a schematic view for describing a structure of a heat dissipation structure according to a first example embodiment.

Hereinafter, example embodiments of the present invention will be described with reference to the drawings. For clarification of the description, omission and simplification are made as appropriate in the following description and the drawings. In the drawings, the same elements are denoted by the same reference signs, and repetitive description thereof is omitted as necessary. The right-handed XYZ-coordinate system illustrated in each of the drawings is for convenience to describe the positional relationship of the elements.

First Example Embodiment

Hereinafter, a first example embodiment will be described. A heat dissipation structure according to the first example embodiment is suitable for a device to be installed outdoors.

FIG. 1 is a schematic view for describing a structure of a heat dissipation structure 1 according to the first example embodiment. As illustrated in FIG. 1, the heat dissipation structure 1 includes a heat generation part 2, an internal heat dissipation part 3, a heat transport member 4, an external heat dissipation part 5, and a fixing member 6.

The heat generation part 2 is provided inside a housing 8. The internal heat dissipation part 3 is provided inside the housing 8 and receives heat from the heat generation part 2. The heat transport member 4 has a bar shape and protrudes from inside the housing 8 to outside the housing 8. Furthermore, a part of a portion of the heat transport member 4 inside the housing 8 is fitted in a first groove 3a formed on the surface of the internal heat dissipation part 3, so as to transport heat from the internal heat dissipation part 3 to outside the housing 8. The external heat dissipation part 5 includes a plurality of fins 5a disposed side by side at a part of a portion of the heat transport member 4 outside the housing 8. The fixing member 6 is disposed between the internal heat dissipation part 3 and the external heat dissipation part 5 and has a through hole 6a for passage of the heat transport member 4. Furthermore, in the fixing member 6, a first surface 6c facing the internal heat dissipation part 3 is in contact with the internal heat dissipation part 3, and a second surface 6d facing the external heat dissipation part 5 is in contact with the external heat dissipation part 5.

A second groove 6b extending from the through hole 6a toward an area not covered with the external heat dissipation part 5 is formed in the second surface 6d. Here, the area not covered with the external heat dissipation part 5 in the second groove 6b corresponds to a portion in a region surrounded by broken line A. Furthermore, a gap portion between the heat transport member 4 and the through hole 6a and the second groove 6b are filled with a sealant for waterproofing. This can suppress entering of water into the housing 8 through the heat transport member 4 in the case where the heat dissipation structure 1 is used for a device to be installed outdoors.

Second Example Embodiment

Hereinafter, a second example embodiment will be described.

A heat dissipation structure according to the second example embodiment is suitable for an electronic device to be installed outdoors, for example, a wireless communication device such as an antenna.

Figure 2:
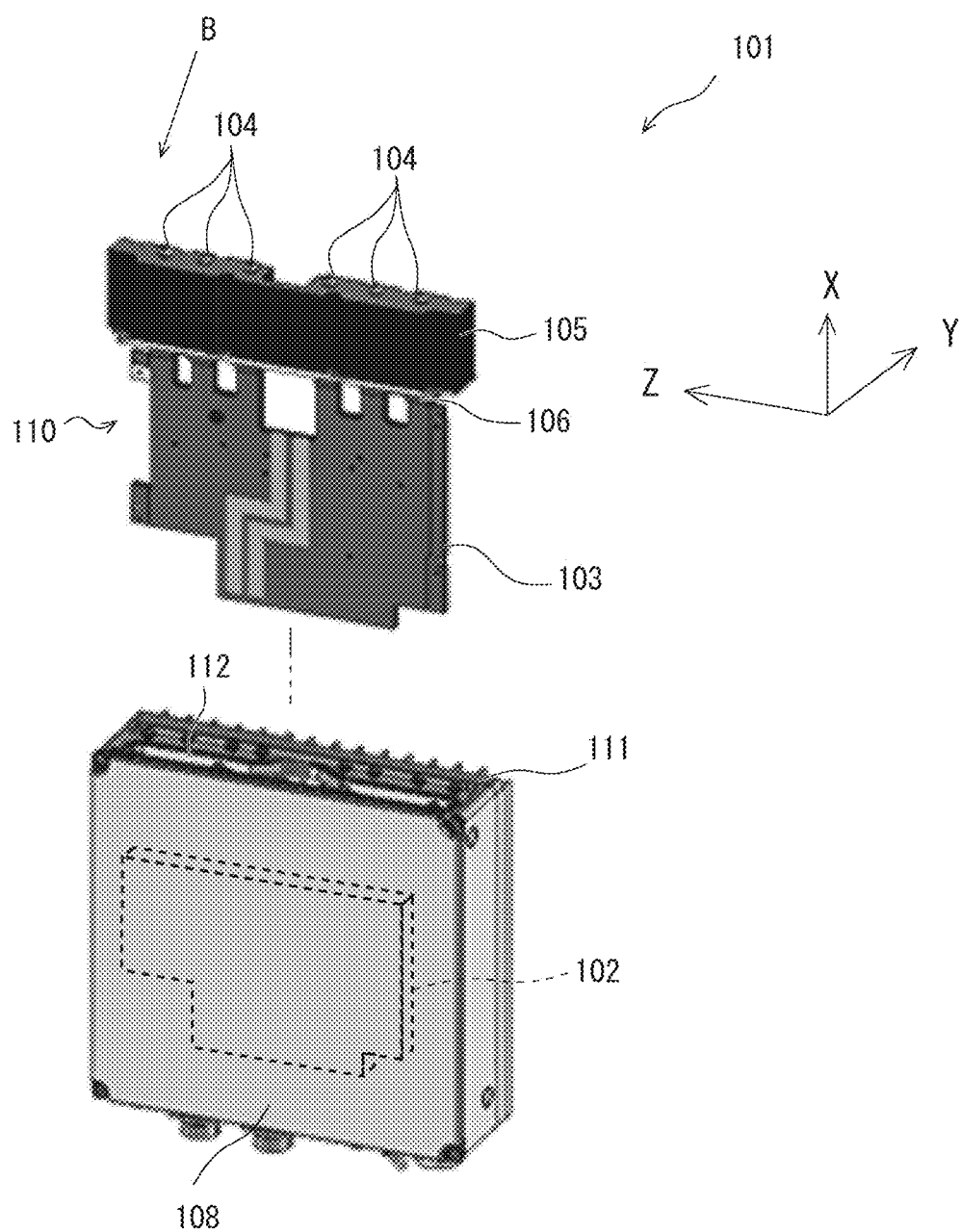
FIG. 2 is a schematic view for describing a structure of a heat dissipation structure according to a second example embodiment.

FIG. 2 is an exploded perspective view for describing a structure of a heat dissipation structure 101 according to the second example embodiment. As illustrated in FIG. 2, the heat dissipation structure 101 includes a heat generation part 102, an internal heat dissipation part 103, a heat transport member 104, an external heat dissipation part 105, and a fixing member 106. The internal heat dissipation part 103, the heat transport member 104, the external heat dissipation part 105, and the fixing member 106 are built up as an assembly 110 and then attached to a housing 108. Accordingly, FIG. 2 depicts a state where the assembly 110 is separated from the housing 108.

The heat generation part 102 is provided inside the housing 108. The heat generation part 102 is, for example, an electronic substrate. The internal heat dissipation part 103 is disposed in contact with the heat generation part 102, inside the housing 108, and receives heat from the heat generation part 102. The heat transport member 104 has a bar shape and protrudes from inside the housing 108 to outside the housing 108 so as to transport heat from the internal heat dissipation part 103 to outside the housing 108.

The heat transport member 104 is, for example, a heat pipe. The heat pipe is a typical one for transporting heat by a phase change (evaporation and condensation) of a small amount of working liquid enclosed in a pipe-shaped container. The typical heat pipe is characterized by having an extremely high thermal conductivity (5000 to 30000 W/m·K), requiring no external power to operate, having a high thermal responsiveness, and having no movable part. The heat transport member 104 is not limited to the heat pipe and may be a copper tube for internally circulating refrigerant or water, a bar formed of a material such as an alloy having a good thermal conductivity, or the like. The number of the heat transport members 104 is optimized by a heat generation amount of a device to be cooled or a surrounding environment.

The external heat dissipation part 105 includes a plurality of fins and is provided at a portion of the heat transport member 104 outside the housing 108. The fixing member 106 is disposed between the internal heat dissipation part 103 and the external heat dissipation part 105 for fixing the assembly 110 to the housing 108. The internal heat dissipation part 103 of the assembly 110 is inserted into an opening 112 formed in the housing 108, and the housing 108 and the fixing member 106 are fastened together by a screw, so that the assembly 110 can be fixed to the housing 108. A peripheral portion of the opening 112 in the housing 108 is provided with a packing part 111. Thus, the housing 108 and the fixing member 106 contact each other via the packing part 111. This makes it possible to secure waterproofness and weather resistance.

Figure 3:
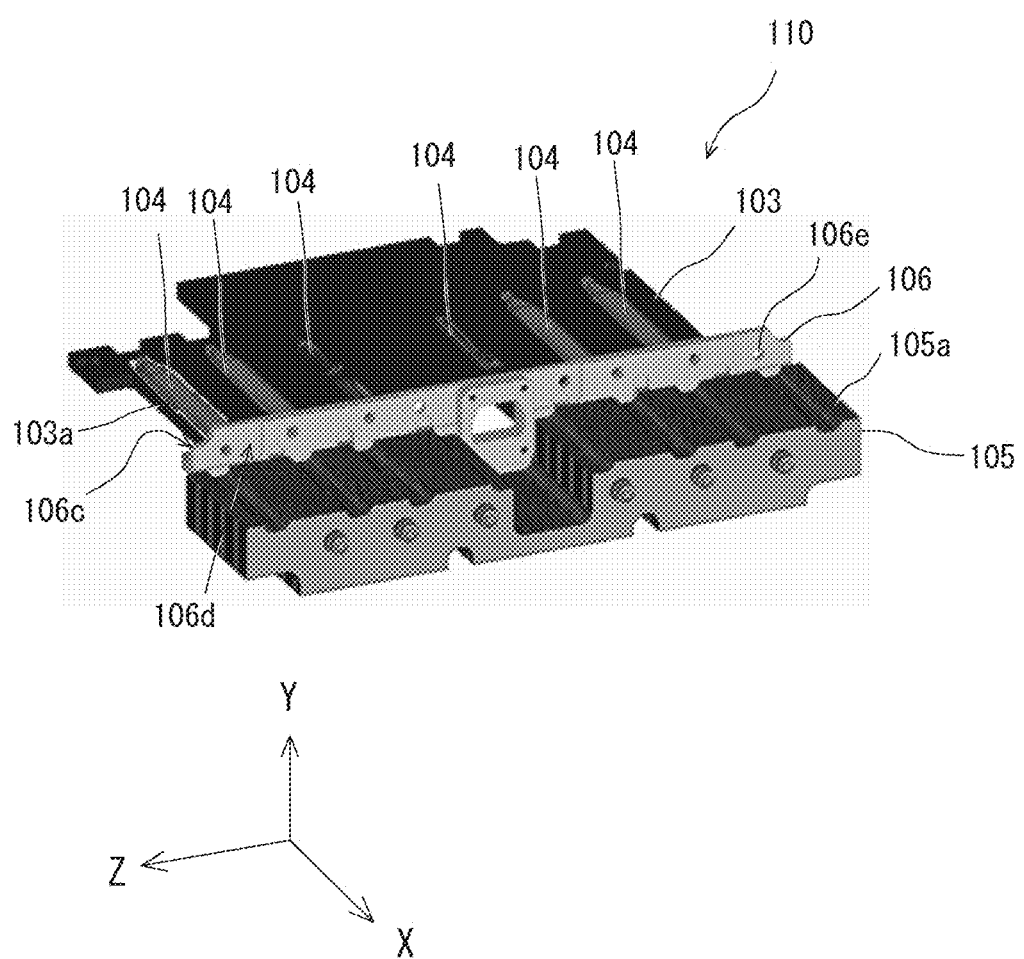
FIG. 3 is a view of an assembly of the heat dissipation structure according to the second example embodiment as viewed from a direction of arrow B illustrated in FIG. 2.

FIG. 3 is a view of the assembly 110 as viewed from the direction of arrow B illustrated in FIG. 2. As illustrated in FIG. 3, a part of a portion of the heat transport member 104 inside the housing 108 is fitted in a first groove 103a formed on the surface of the internal heat dissipation part 103. Fixing of the internal heat dissipation part 103 and the heat transport member 104 is performed by using, for example, solder. Specifically, the internal heat dissipation part 103 and the heat transport member 104 are put in a reflow furnace, in a state where a cream solder is disposed between the heat transport member 104 and the first groove 103a. Then, it is heated in the reflow furnace to melt the cream solder, so that the heat transport member 104 and the internal heat dissipation part 103 are joined together.

The external heat dissipation part 105 includes a plurality of fins 105a disposed side by side in the longitudinal direction of the heat transport member 104. The material of the fins 105a, which is typically aluminum, may be copper. Fixing of the fins 105a and the heat transport member 104 is performed by using solder, caulking, brazing, or the like.

A first surface 106c of the fixing member 106 which faces the internal heat dissipation part 103 is in contact with the internal heat dissipation part 103. Furthermore, a second surface 106d of the fixing member 106 which faces the external heat dissipation part 105 is in contact with the external heat dissipation part 105. A plurality of screw insertion holes 106e for screwing the fixing member 106 to the housing 108 is formed in the fixing member 106.

Figure 4:
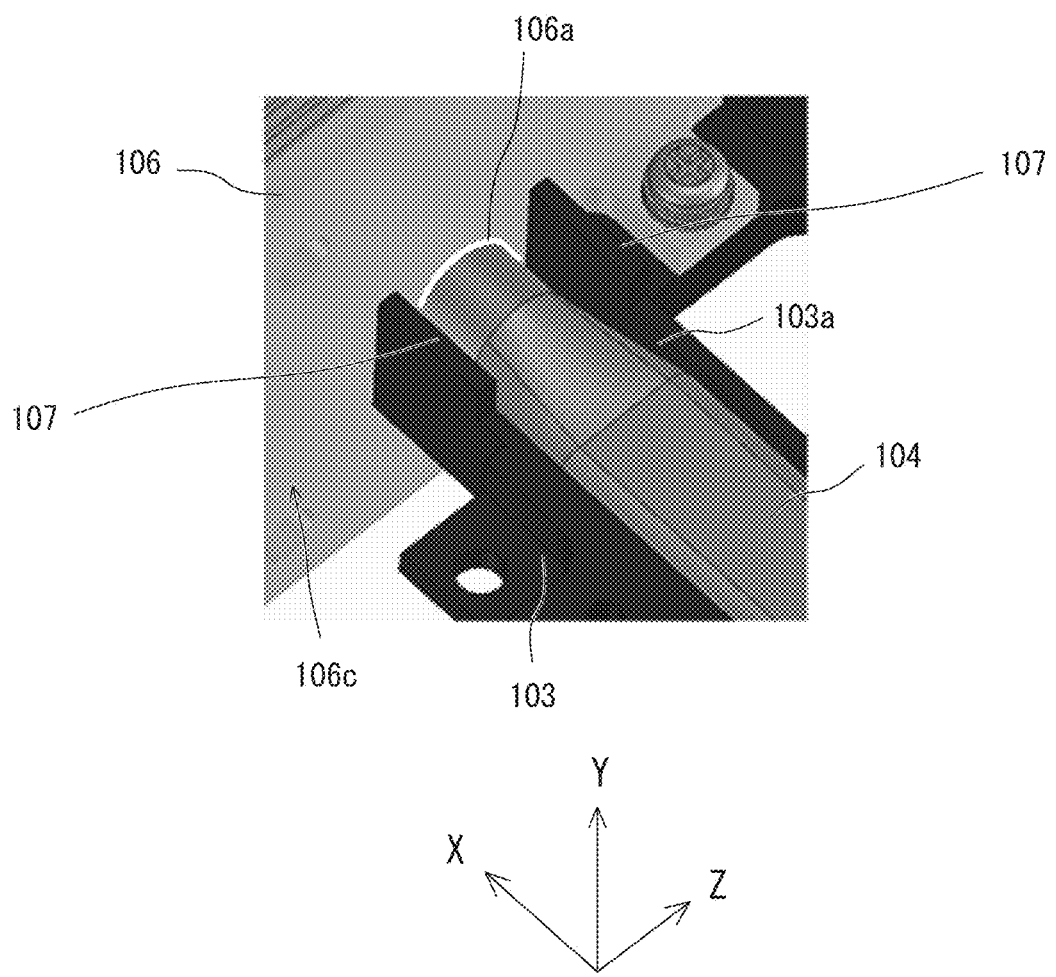
FIG. 4 is an enlarged view of the heat dissipation structure according to the second example embodiment in the vicinity of a heat transport member in a first surface of a fixing member.

FIG. 4 is an enlarged view of the vicinity of the heat transport member 104 in the first surface 106c of the fixing member 106. As illustrated in FIG. 4, a through hole 106a for passage of the heat transport member 104 is formed in the fixing member 106. As a matter of course, the diameter of the through hole 106a is larger than the diameter of the heat transport member 104. In other words, when the heat transport member 104 is passed through the through hole 106a, a gap is generated between the through hole 106a and the heat transport member 104. Edges 107 are vertically disposed on both sides of the heat transport member 104, in the vicinity of the fixing member 106 in the first groove 103a formed in the internal heat dissipation part 103.

Figure 5:
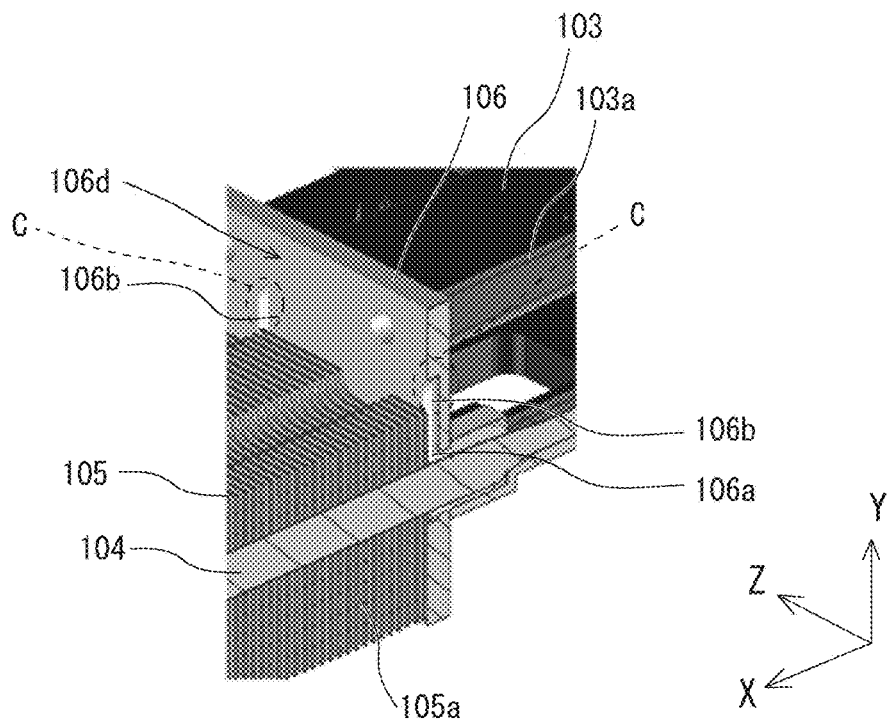
FIG. 5 is an enlarged view of the vicinity of a through hole in a second surface of the fixing member.
Figure 5:
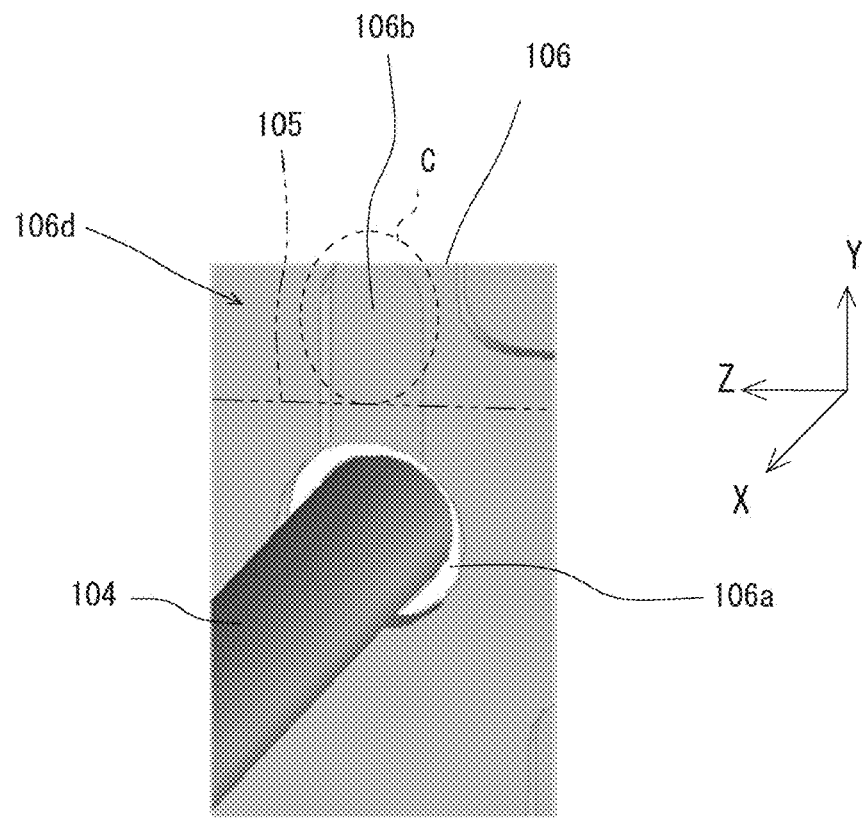

FIG. 5 is an enlarged view of the vicinity of the through hole 106a in the second surface 106d of the fixing member 106. For convenience of the description, in FIG. 5, the upper view is a view in which the external heat dissipation part 105 is depicted, and the lower view is a view in which the external heat dissipation part 105 is not depicted. As illustrated in FIG. 5, a second groove 106b extending from the through hole 106a toward an area not covered with the external heat dissipation part 105 is formed in the second surface 106d. Here, the area not covered with the external heat dissipation part 105 in the second groove 106b corresponds to a portion in a region surrounded by broken line C.

Figure 6:
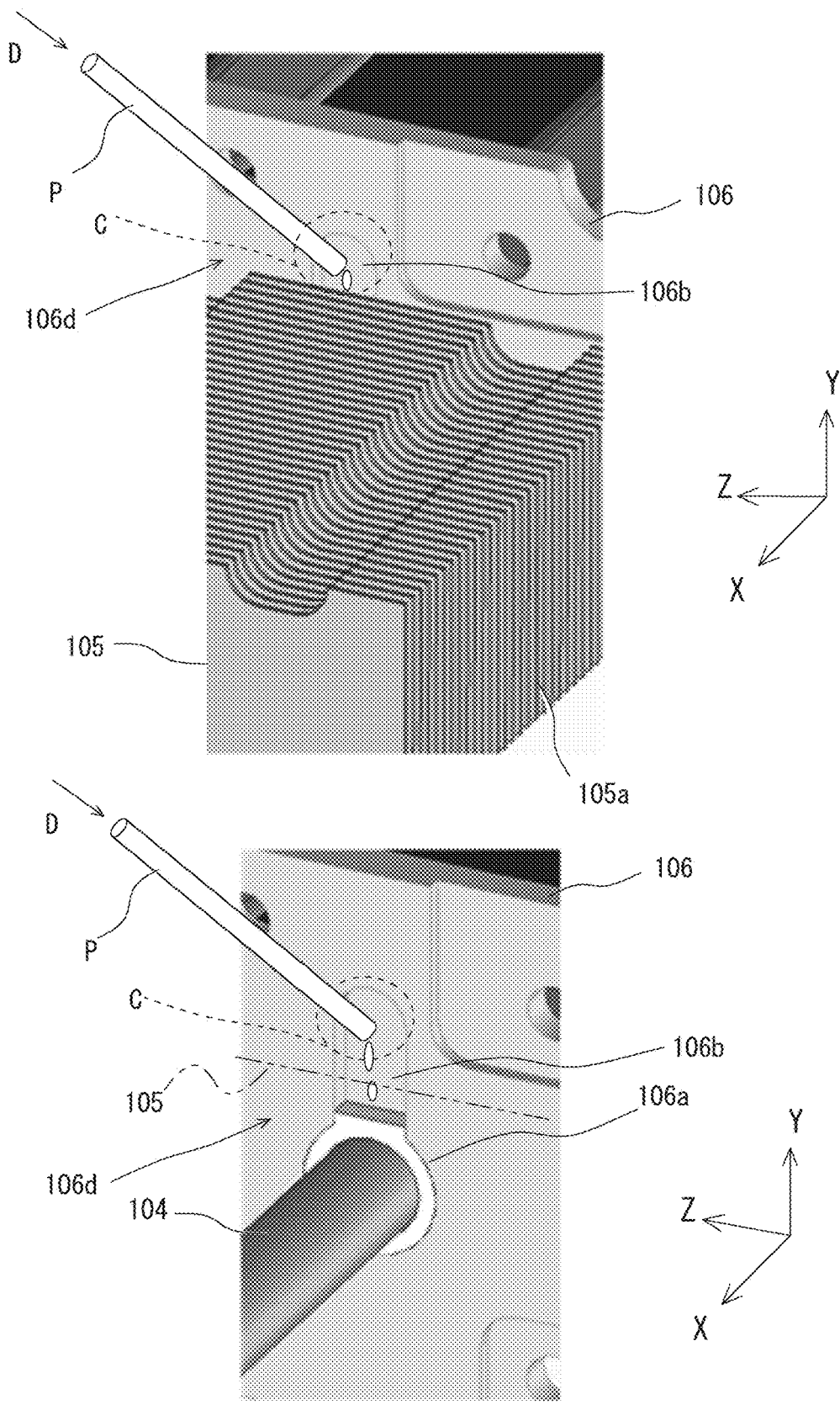
FIG. 6 is a schematic view for describing an area to be filled with a sealant for waterproofing in the second surface of the fixing member.

FIG. 6 is a schematic view for describing an area to be filled with a sealant for waterproofing in the second surface 106d of the fixing member 106. For convenience of the description, in FIG. 6, the upper view is a view in which the external heat dissipation part 105 is depicted, and the lower view is a view in which the external heat dissipation part 105 is not depicted. As illustrated in the upper view of FIG. 6, from the area not covered with the external heat dissipation part 105 in the second groove 106b in the region surrounded by broken line C, the sealant is injected by a nozzle P from a direction of arrow D. Thus, as illustrated in the lower view of FIG. 6, the second groove 106b and a gap portion between the heat transport member 104 and the through hole 106a are filled with the sealant. The sealant contains, for example, silicone or epoxy resin as its main component.

Figure 7:
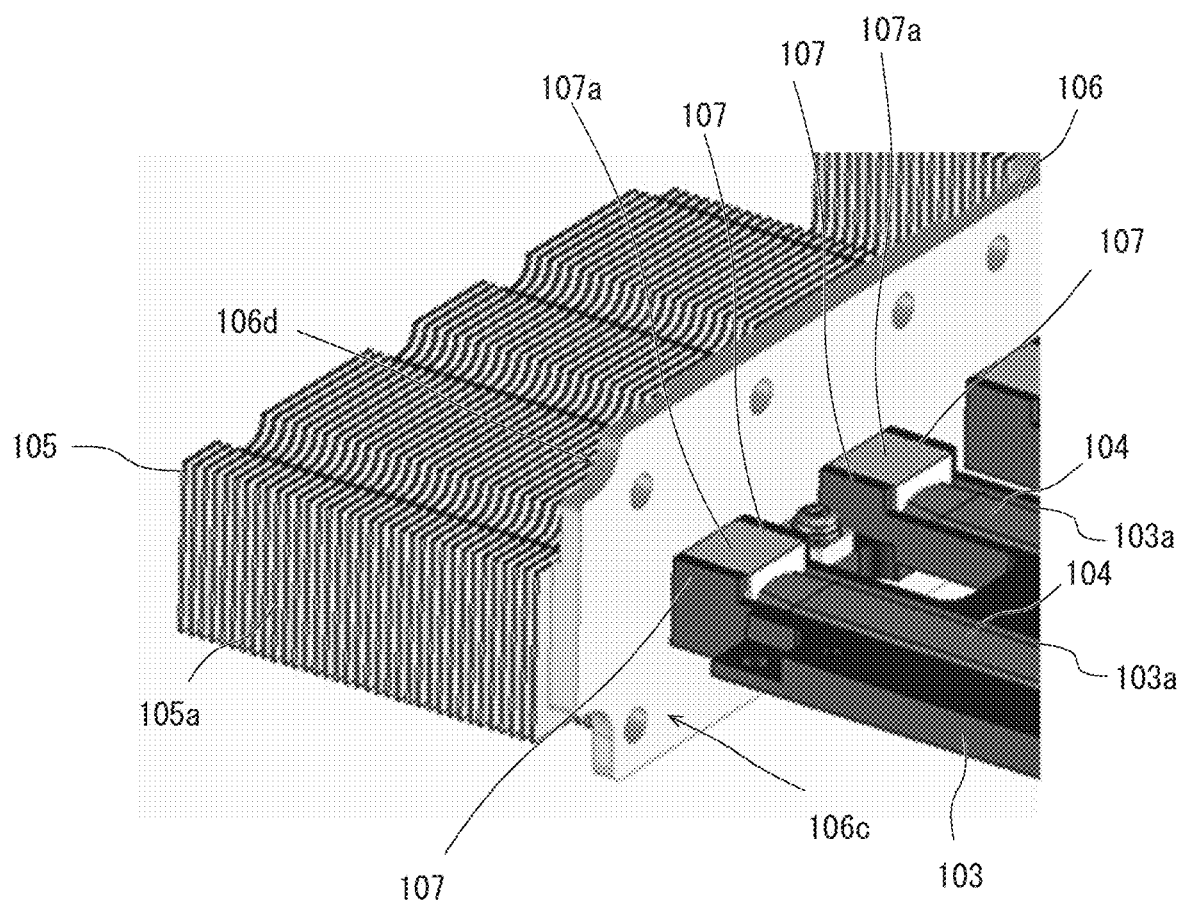
FIG. 7 is a schematic view for describing an area to be filled with a sealant for waterproofing in the first surface of the fixing member.

FIG. 7 is a schematic view for describing an area to be filled with a sealant for waterproofing in the first surface 106c of the fixing member 106. Once the sealant is injected from the nozzle P illustrated in FIG. 6, the sealant leaks out from the gap portion between the heat transport member 104 and the through hole 106a to the second surface 10d of the fixing member 106, and a portion 107a between the edges 107 vertically disposed on both sides of the heat transport member 104 is also filled with the sealant as illustrated in FIG. 7. Furthermore, a gap between the heat transport member 104 and the first groove 103a is also filled with the sealant. This can satisfactorily suppress entering of water into the housing 108 through the heat transport member 104 in the case where the heat dissipation structure 101 is used for a device to be installed outdoors. In addition to injection of the sealant from the area not covered with the external heat dissipation part 105 in the second groove 106b illustrated in FIG. 6, the sealant may be injected from above the portion 107a between the edges 107. This makes it possible to more reliably fill the second groove 106b, the gap portion between the heat transport member 104 and the through hole 106a, and the portion 107a between the edges 107, with the sealant.

[Problems of Heat Dissipation Structure According to Comparative Example]

Figure 8:
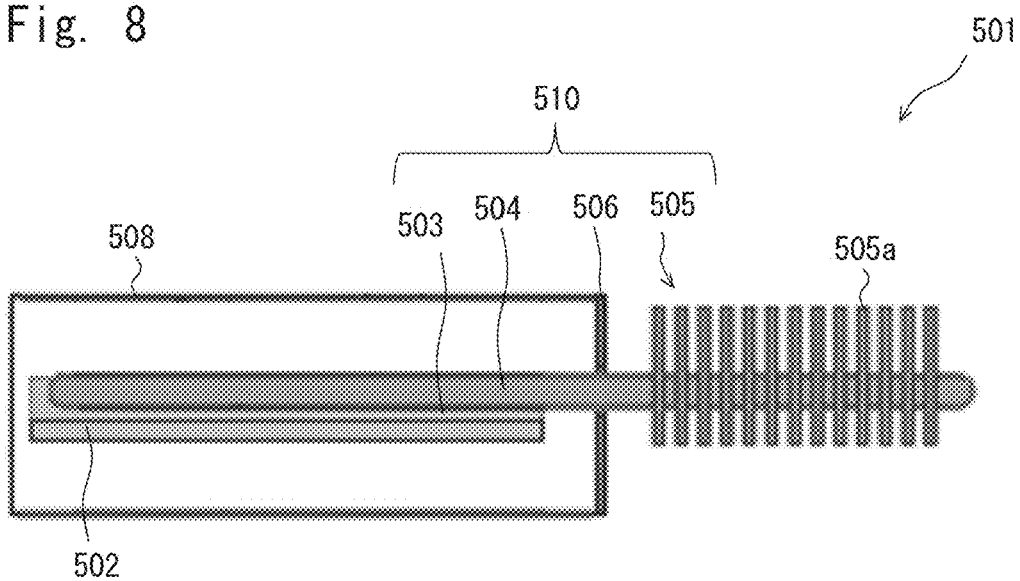
FIG. 8 is a schematic view for describing a waterproof structure of a heat dissipation structure according to a comparative example.

Next, problems with a waterproof structure of a heat dissipation structure according to a comparative example will be described. FIG. 8 is a schematic view for describing a waterproof structure of a heat dissipation structure 501 according to the comparative example. As illustrated in FIG. 8, the heat dissipation structure 501 includes a heat generation part 502, an internal heat dissipation part 503, a heat transport member 504, an external heat dissipation part 505, and a fixing member 506.

The heat generation part 502 is provided inside a housing 508. The internal heat dissipation part 503 is disposed in contact with the heat generation part 502, inside the housing 508, and receives heat from the heat generation part 502. The heat transport member 504 has a bar shape and protrudes from inside the housing 508 to outside the housing 508 so as to transport heat from the internal heat dissipation part 503 to outside the housing 508. The external heat dissipation part 505 includes a plurality of fins 505a and is provided at a portion of the heat transport member 504 outside the housing 508. The fixing member 506 is disposed between the internal heat dissipation part 503 and the external heat dissipation part 505. The internal heat dissipation part 503, the heat transport member 504, the external heat dissipation part 505, and the fixing member 506 are built up as an assembly 510 and then attached to the housing 508. The fixing member 506 is for fixing the assembly 510 to the housing 508.

Figure 9:
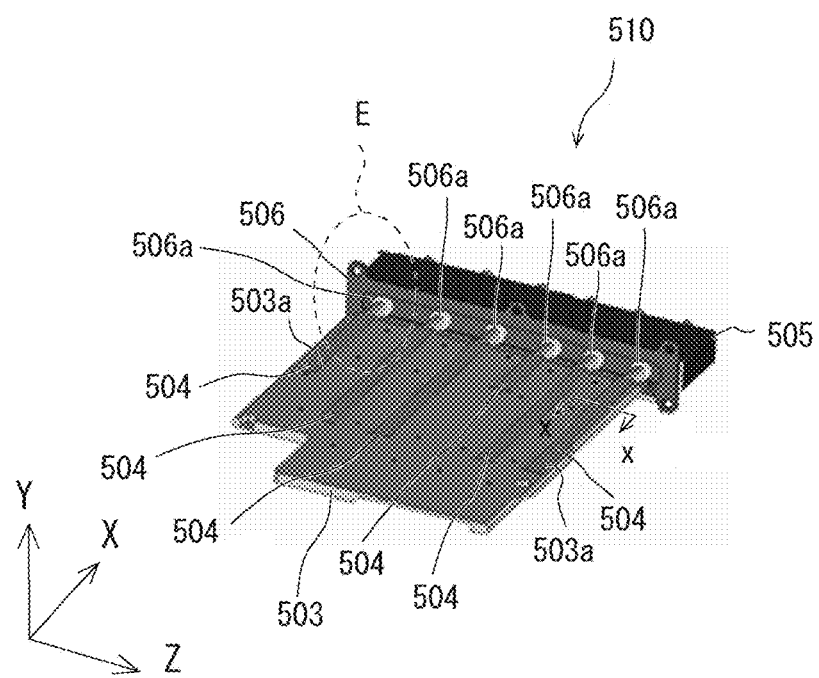
FIG. 9 is a schematic view illustrating a configuration of an assembly of the heat dissipation structure according to the comparative example.

FIG. 9 is a schematic view illustrating a configuration of the assembly 510. As illustrated in FIG. 9, a part of a portion of the heat transport member 504 inside the housing 508 is fitted in a first groove 503a formed on the surface of the internal heat dissipation part 503. In the case where the heat dissipation structure 501 is used for a device to be installed outdoors, a waterproof structure for preventing entering of water into the housing 508 through the heat transport member 504 is essential. Accordingly, a gap portion between the heat transport member 504 and a through hole 506a and a gap between the heat transport member 504 and the first groove 503a need to be filled with a sealant.

Figure 10:
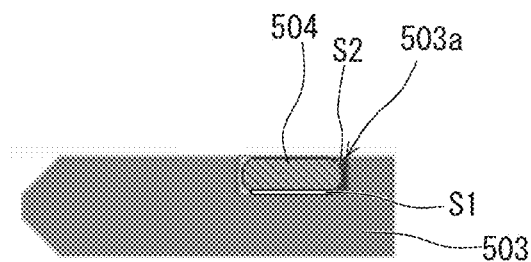
FIG. 10 is a cross-sectional view taken along line x-x of FIG. 9.

FIG. 10 is a cross-sectional view taken along line x-x of FIG. 9. As illustrated in FIG. 10, a cream solder is disposed in an interval S1 between the first groove 503a formed in the internal heat dissipation part 503 and the heat transport member 504, and the solder is melted in a reflow furnace, so that the internal heat dissipation part 503 and the heat transport member 504 are joined together (reflow step). As described above, waterproofing is achieved through filling a gap S2 between the heat transport member 504 and the first groove 503a with a sealant. A sealing step of filling, with a sealant, the gap portion between the heat transport member 504 and the through hole 506a (see FIG. 9) and the gap between the heat transport member 504 and the first groove 503a needs to be performed after the reflow step. This is because if the sealing step is performed before the reflow step, the sealant melts at the time of overheating in the reflow furnace.

In the heat dissipation structure 501, in the case where the heat generation part 502 is disposed below the heat transport member 504 in the vertical direction and the external heat dissipation part 505 is disposed above the heat transport member 504 in the vertical direction, the heat dissipation performance of the heat transport member 504 becomes highest. In such disposition, in order to avoid a risk of corrosion of the fixing member 506 due to accumulation of water in the fixing member 506, the sealant needs to be injected from the external heat dissipation part 505 side.

Figure 11:
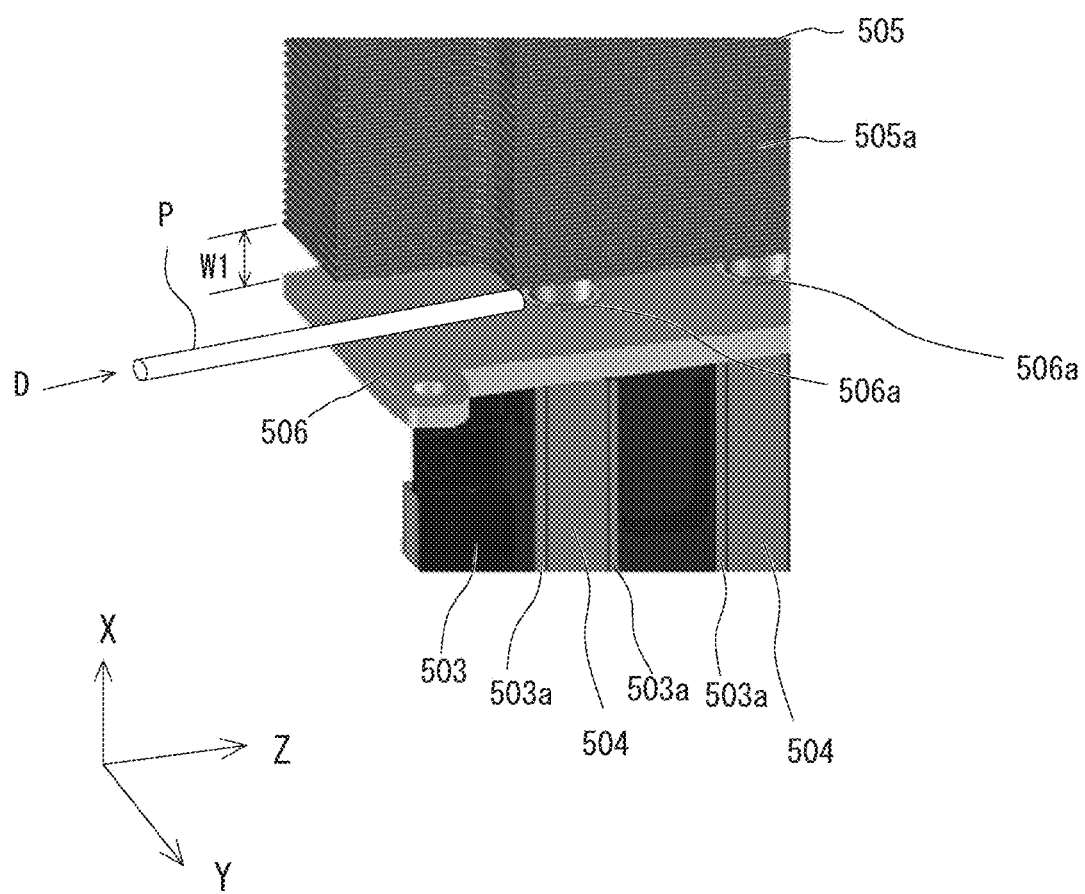
FIG. 11 is a schematic view for describing a sealing step of the heat dissipation structure according to the comparative example.

FIG. 11 is a schematic view for describing the sealing step. In order to fill the gap portion between the heat transport member 504 and the through hole 506a with the sealant from the external heat dissipation part 505 side after performing the reflow step, it is necessary to provide a substantial distance W1 between the external heat dissipation part 505 and the fixing member 506 (about 10 to 20 mm) as illustrated in FIG. 11. This is for the tip of the nozzle P for injecting the sealant to reach the gap between the heat transport member 504 and the through hole 506a of the fixing member 506. However, a problem is that provision of the substantial distance between the external heat dissipation part 505 and the fixing member 506 for manufacturing reason creates a wasted space and leads to an increase in the device size.

In contrast to the configuration of the comparative example, in the above-described configurations of the heat dissipation structures according to the first and second example embodiments, the second groove extending from the through hole toward the area not covered with the external heat dissipation part is formed in the fixing member. Thus, even in the case where the fixing member and the external heat dissipation part are disposed in contact with each other, the sealant can be injected from the area not covered with the external heat dissipation part in the second groove. Therefore, it is not necessary to provide a space for inserting the nozzle for injecting the sealant, between the fixing member and the external heat dissipation part, so that no wasted space is created and the device size is not increased. In other words, the heat dissipation capacity with respect to the installation space can be improved.

Furthermore, in the configurations of the heat dissipation structures according to the first and second example embodiments, once the sealant is dropped from the area not covered with the external heat dissipation part in the second groove, the second groove and the gap portion between the heat transport member and the through hole are filled with the sealant. Furthermore, the sealant leaks out from the gap portion between the heat transport member and the through hole to the internal heat dissipation part side in the fixing member, and the portion between the edges vertically disposed on both sides of the heat transport member is also filled with the sealant. Furthermore, the gap between the heat transport member and the first groove is also filled with the sealant. This can satisfactorily suppress entering of water into the housing through the heat transport member in the case where the heat dissipation structure is used for a device to be installed outdoors.

In particular, in the case where a configuration of a heat dissipation structure for dissipating heat inside the housing to outside via the heat transport member employs a heat pipe as the heat transport member, the heat dissipation structures according to the first and second example embodiments can be satisfactorily used. A heat pipe enhances heat dissipation efficiency and thus needs to be disposed so that the heat input portion is on the lower side and the heat dissipation portion is on the upper side. In other words, the heat dissipation structure needs to be disposed so that the internal heat dissipation part whose heat is input to the heat pipe is on the lower side and the external heat dissipation part for dissipating heat of the heat pipe is on the upper side. In the case where the heat dissipation structure is thus disposed, the fixing member is located on the upper side of the housing, and thus, when the heat dissipation structure is installed outdoors, rainwater falls directly on the fixing member. Accordingly, the gap portion between the heat transport member and the through hole in the fixing member needs to be more reliably waterproofed. In the heat dissipation structures according to the first and second example embodiments, the gap portion between the heat transport member and the through hole can be reliably filled with a sealant via the second groove. Furthermore, in the heat dissipation structures according to the first and second example embodiments, no wasted space needs to be provided between the fixing member and the external heat dissipation part. Therefore, the heat dissipation structures according to the first and second example embodiments, in the case where a heat pipe is employed as the heat transport member, can satisfactorily suppress entering of water into the housing through the heat transport member and can improve the heat dissipation capacity with respect to the installation space.

The heat dissipation structure employing the heat pipe is advantageous in that the heat dissipation structure can be downsized, as compared with a heat dissipation structure with a configuration in which refrigerant or water is circulated inside a tube such as a copper tube. A wireless communication device to be installed outdoors is often limited in installation space and thus required to be further downsized. Accordingly, a heat dissipation structure to be used for a wireless communication device is preferred to employ a heat pipe as the heat transport member. Therefore, the heat dissipation structures according to the first and second example embodiments, even in the case of the use for a wireless communication device, can satisfactorily suppress entering of water into the housing through the heat transport member and can improve the heat dissipation capacity with respect to the installation space.

The present invention is not limited to the above example embodiments and may be changed as appropriate without departing from the gist of the present invention. Furthermore, the plurality of examples described above can be combined with each other as appropriate and implemented.

The present invention has been described above with reference to the example embodiments, but the present invention is not limited to the above.

Various changes which can be understood by those skilled in the art can be made to the configurations and details of the present invention within the scope of the invention.

This application claims priority based on Japanese Patent Application No. 2018-213184 filed on Nov. 13, 2018, the disclosure of which is incorporated herein in its entirety.

REFERENCE SIGNS LIST 1, 101 heat dissipation structure
2, 102 heat generation part
3, 103 internal heat dissipation part
3a, 103a first groove
4, 104 heat transport member
5, 105 external heat dissipation part
5a, 105a fin
6, 106 fixing member
6a, 106a through hole
6b, 106b second groove
6c, 106c first surface
6d, 106d second surface
8, 108 housing
106e screw insertion hole
107 edge
110 assembly 111 packing part
112 opening

What is claimed is:

1. An apparatus comprising comprising:
   a housing inside of which a substrate is provided;
   an internal heat dissipation part provided inside the housing for receiving heat from the substrate, wherein the internal heat dissipation part includes a surface on which a first groove is formed;
   a heat transport member comprising a bar shape and protruding from inside the housing to outside the housing, a part of a portion of the heat transport member inside the housing being fitted in the first groove, so as to transport heat from the internal heat dissipation part to outside the housing;
   an external heat dissipation part comprising a plurality of fins disposed side by side at a part of a portion of the heat transport member outside the housing; and
   a fixing member disposed between the internal heat dissipation part and the external heat dissipation part and comprising a through hole for passage of the heat transport member, the fixing member comprising a first surface facing the internal heat dissipation part, and a second surface facing the external heat dissipation part, the first surface being in contact with the internal heat dissipation part, the second surface being in contact with the external heat dissipation part, wherein
   a second groove extending from the through hole toward an area not covered with the external heat dissipation part is formed in the second surface,
   a gap portion between the heat transport member and the through hole is filled with a sealant for waterproofing, and
   the second groove is filled with the sealant for waterproofing.

2. The heat dissipation structure according to claim 1, wherein
   edges are vertically disposed on both sides of the heat transport member, in a vicinity of the fixing member in the first groove, and
   a portion between the edges vertically disposed on both sides of the heat transport member is filled with a sealant for waterproofing.

3. The heat dissipation structure according to claim 1, wherein the heat transport member is fixed to the internal heat dissipation part by solder.

4. The heat dissipation structure according to claim 1, wherein the heat transport member is a heat pipe.

5. The heat dissipation structure according to claim 1, wherein the housing is a housing for a wireless communication device, and the wireless communication device is installed outdoors.

* * * * *